United States Patent
Kobayashi et al.

(10) Patent No.: US 6,755,921 B2
(45) Date of Patent: Jun. 29, 2004

(54) NICKEL-BASED SINGLE CRYSTAL ALLOY AND A METHOD OF MANUFACTURING THE SAME

(75) Inventors: Toshiharu Kobayashi, Ibaraki (JP); Yutaka Koizumi, Ibaraki (JP); Shizuo Nakazawa, Ibaraki (JP); Hiroshi Harada, Ibaraki (JP); Toshihiro Yamagata, Ibaraki (JP)

(73) Assignee: National Research Institute for Metals, Ibaraki (JP)

( * ) Notice: Subject to any disclaimer, the term of this patent is extended or adjusted under 35 U.S.C. 154(b) by 0 days.

(21) Appl. No.: 10/139,352

(22) Filed: May 7, 2002

(65) Prior Publication Data

US 2002/0124915 A1 Sep. 12, 2002

Related U.S. Application Data

(63) Continuation of application No. 09/874,970, filed on Jun. 7, 2001, now abandoned, which is a continuation of application No. 09/159,494, filed on Sep. 23, 1998, now abandoned.

(30) Foreign Application Priority Data

Oct. 31, 1997 (JP) .............................. 9-316111

(51) Int. Cl.$^7$ ................................ C22C 19/05
(52) U.S. Cl. .................. 148/410; 148/675; 420/445; 420/448
(58) Field of Search ................. 148/675, 410; 420/448, 445

(56) References Cited

U.S. PATENT DOCUMENTS 5,366,695 A 11/1994 Erickson

Primary Examiner—Andrew L. Oltmans
(74) Attorney, Agent, or Firm—Wenderoth, Lind & Ponack, L.L.P.

(57) ABSTRACT

The present inventions offer a nickel-based single crystal alloy which has a high strength, is easy in conducting the solution heat treatment, hardly gives a harmful phase and is resistant to corrosion at high temperature. A nickel-based single crystal alloy is offered where the composition consists of 7–15 of Co, 0.1–4 of Cr, 1–4 of Mo, 4–7 of W, 5.5–6.5 of Al, 5–7 of Ta, 4–5.5 of Re, 0–0.5 each of Hf and V, and 0–2 each of Ti and Nb in terms of % by weight and residual part substantially consists of Ni wherein said alloy may contain unavoidable impurities.

11 Claims, 4 Drawing Sheets

NICKEL-BASED SINGLE CRYSTAL ALLOY AND A METHOD OF MANUFACTURING THE SAME

This application is a continuation application of Ser. No. 09/874,970 filed Jun. 7, 2001 now abandoned, which is a continuation application of Ser. No. 09/159,494 filed Sep. 23, 1998 now abandoned.

FIELD OF THE INVENTION

The inventions of the present application relate to a nickel-based single crystal alloy and also to a method of manufacturing the same. More particularly, they relate to a novel and highly strong nickel-based single crystal alloy having excellent strength at high temperature and anti-corrosive property at high temperature which is useful as a material to be used under high temperature and high stress such as turbine blades and turbine vanes for jet engines and gas turbines for industrial purposes.

PRIOR ART

Nickel-based single crystal alloys have been known as heat-resistant alloys used for high-temperature machinery and tools such as jet engines and gas turbines for industrial purposes.

For example, in order to promote the efficiency of gas turbine, it is the most effective method to raise the inlet gas temperature and, for such a purpose, it is essential to improve the high temperature strength of the materials used at high temperature and high stress. From such a viewpoint, there have been more and more improvements in the high temperature strenght of nickel-based superalloy year by year and, at present, with regard to the nickel-based single crystal superalloy, commercial alloys such as ReneN6 and CMSX10 which are called the third generation single crystal alloys have been developed and used.

Actually, however, those nickel-based single crystal superalloys of the third generation have problems. The first problem is that their solution heat treatment is not easy. In the nickel-based single crystal alloys of the third generation, the amount of chromium is reduced as much as possible and, in place of that, rhenium is added in large amount so that a decrease in corrosion resistance by a reduction of the amount of chromium is compensated by rhenium whereby good corrosion resistance at high temperature is maintained and a high strength at the medium temperature of up to 1,000° C. is achieved.

However, the heat treatment of those nickel-based single crystal alloys of the third generation is becoming to higher temperature and becoming complicated as well. For example, in the case of CMSX-10, about ten steps of solution treatments for 45 hours in total at 1,360° C. at the highest are necessary.

Accordingly, there has been a practical demand for new technical means whereby strength at high temperature can be improved without deteriorating the corrosion resistance at high temperature and, in addition, the solution heat treatment is easy.

In addition to the above problem, there is another problem that, as a material for high temperature for actual use, a harmful phase is formed within a short period during the use at the temperature of as high as not lower than 1,000° C. Then, the third problem is that, due to said harmful phase, the strength lowers to the level of same as or even lower than that of the second generation single crystal superalloys at conditions of high temperature for long time.

Under such circumstances, the inventions of the present application are to solve the above-mentioned problems in the nickel-based single crystal alloys of the third generation and to offer novel nickel-based single crystal alloy where the solution heat treatment is easy and strength at high temperature and corrosion resistance at high temperature are excellent and also to offer a method of manufacturing the same.

MEANS TO SOLVE THE PROBLEMS

In order to solve the above-mentioned problems, the first invention of the present application offers a nickel-based single crystal alloy, characterized in that, the composition consists of 7–15 of Co, 0.1–4 of Cr, 1–4 of Mo, 4–7 of W, 5.5–6.5 of Al, 5–7 of Ta, 4–5.5 of Re, 0–0.5 each of Hf and V, and 0–2 each of Ti and Nb in terms of % by weight and residual part substantially consists of Ni where said alloy may contain unavoidable impurities.

The present application further offers a nickel-based single crystal alloy according to the above-mentioned first invention wherein said alloy contains 10–14 of Co, 2–3 of Cr, 1.5–2.5 of Mo, 5–6.5 of W, 5.7–6.3 of Al, 5.5–6.5 of Ta, 4.5–5 of Re and 0.01–0.3 of Hf in terms of % by weight.

The present application furthermore offers a method of manufacturing a nickel-based single crystal alloy as mentioned in the above first or second invention, characterized in that, a solution heat treatment is conducted at the temperature range of 1,310–1,350° C. and a aging heat treatment is conducted at the temperature range of 850–1,200° C.

The prevent application still furthermore offers a method of manufacturing the nickel-based single crystal alloy according to the above-mentioned method wherein the solution heat treatment is conducted within ten hours and the aging heat treatment is conducted within thirty hours; a method of manufacturing the nickel-based single crystal alloy wherein each of the solution heat treatment and the aging heat treatment is conducted in a single step or by means of temperature changes in two to four steps; and a method of manufacturing the nickel-based single crystal alloy wherein a preliminary thermal treatment at from 1,290° C. to lower than 1,310° C. for two hours or shorter is conducted prior to the solution heat treatment.

EMBODIMENTS OF THE INVENTIONS

Figure 1:
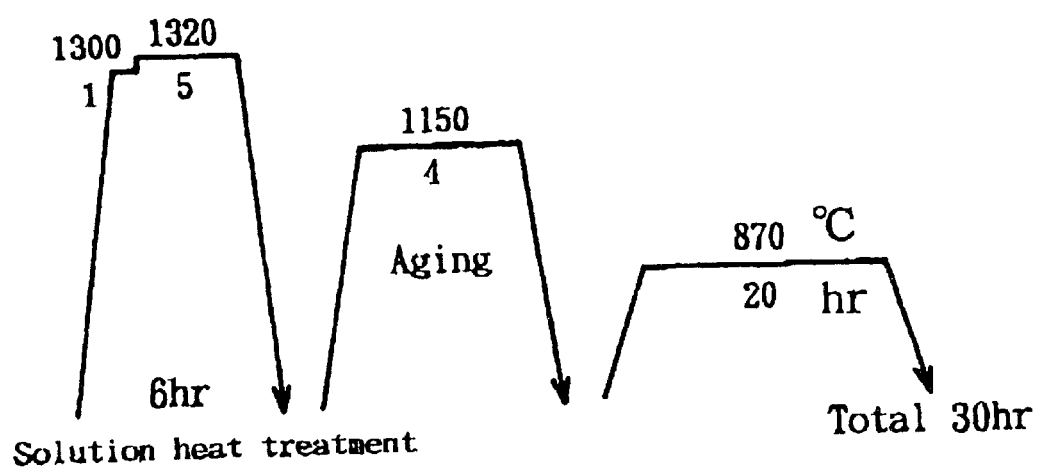
FIG. 1 is a drawing which shows the heat treatments of TMS-75 alloy which is an example of the present inventions.

The inventions of the present application are characterized as the nickel-based single crystal alloy having the above-mentioned specific composition and noticeable functions such as that the solution treatment is far easier as compared with the conventional methods and the time required for the heat treatment can be made shorter, that harmful phase is hardly formed even when used at high temperature for long time, that the mierostructure is stable and the strength at high temperature is high, and that corrosion resistance at high temperature is good can be achieved.

The nickel-based single crystal alloy of the present inventions having such characteristic features can be manufactured in such a manner that starting materials in a predetermined composition are dissolved, made into single crystals by, for example, means of a directional solidification as in the conventional methods and subjected to a solution heat treatment and aging heat treatments. The treatments at that time may be conducted under far more simple conditions as compared with the conventional methods.

As mentioned already, the solution treatment may be conducted within a temperature range of 1,310–1,350° C. and the aging treatment may be conducted within a temperature range of 850–1,200° C. as a suitable embodiment. In those heat treatments, changes in the set temperature may be sufficient in a single step or in two to four steps. The solution heat treatment may be conducted within ten hours or rather within about six hours while the aging treatment may be conducted within thirty hours or rather within about twenty-six hours. The tern "about" used here stands for ±two hours.

Prior to the solution heat treatment, a preliminary heat treatment at from 1,290° C. to lower than 1,310° C. for within two hours may be conducted so that switching to the solution heat treatment can take place smoothly.

As such, the nickel-based single crystal alloy of the present inventions can be achieved by the heat treatments which are far more simple as compared with those in the conventional methods. As a result of the heat treatments, all γ'-phases solutioned containing small amount of eutectic γ'-phase are solutioned and then fine coherent γ' precipitation takes place forming cubes whereby no harmful phase was formed.

The solution heat treatment is to solution the γ'-phase and the eutectic γ'-phase existing in single crystal into a γ-phase which is a matrix phase. Then, as a result of aging heat treatment, a microstructure wherein fine γ' particles are homogeneously precipitated and dispersed is obtained.

Limitation of the composition (% by weight) of the alloy is due to the following reasons.

Co is 7–15%. When the amount is more than 15%, amount of the γ' phase becomes smaller and the strength is lowered. When it is less than 7%, the temperature range for giving solid solution becomes narrower. Therefore, it is necessary that the amount of Co is 7–15% and, preferably, 10–14%.

When the amount of Cr is more than 4%, a TCP phase which is a harmful phase is formed while, when it is less than 0.1%, corrosion resistance at high temperature lowers. Therefore, it is necessary that the amount of Cr is 0.1–4% and, preferably, 2–3%.

When the amount of Mo is more than 4%, a TCP phase is formed while, when it is less than 1%, a raft effect obtained by making the misfit of γ and γ' minus is insufficient. Therefore, it is necessary that the amount of Mo is 1–4% and, preferably, 1.5–2.5%.

When the amount of W is more than 7%, a TCP phase is formed while, when it is less than 4%, strength of the solid solution is incomplete whereby creep strength lowers. Therefore, it is necessary that the amount of W is 4–7% and, preferably, 5–6.5%.

When the amount of Al is more than 6.5%, amount of the eutectic γ' phase becomes much and the solution heat treatment is difficult while, when it is less than 5.5%, amount of the precipitated γ' phase becomes small whereby the strength lowers. Therefore, it is necessary that the amount of Al is 5.5–6.5% and, preferably, 5.7–6.3%.

When the amount of Ta is more than 7%, amount of the eutectic γ' phase becomes much and the solution heat treatment is difficult while, when it is less than 5%, strength of solid solution of the γ' phase is insufficient whereby the strength lowers. Therefore, it is necessary that the amount of Ta is 5–7% and, preferably, 5.5–6.5%.

When the amount of Re is more than 5.5%, a TCP phase is formed and, in addition, temperature range for giving solid solution becomes narrower while, when it is less than 4%, solid solution strength of the γ phase is insufficient whereby the strength lowers. Therefore, it is necessary that the amount of Re is 4–5.5% and, preferably, 4.5–5%.

Besides the above, Hf, V, Ti and Nb which are the minore elements may be added, either solely or jointly, thereto for improving the strength.

With respect to Hf and V, each of their amounts is 0–0.5% and, with respect to Ti and Nb, each of their amounts is 0–2%. Although each of those elements is not essential, it is preferred that at least one or two of them is/are added within the above-mentioned range. More preferably, it is appropriate that at least Hf is added in an amount of 0.01–0.3% by weight.

Further, C and B may be added to prepare a nickel-based directionally solidified (DS) alloy or an conventionally casting (CC) alloy. In that case, addition of 0.01–0.2% by weight of C (carbon) and 0.001–0.05% by weight of B (boron) is suitably considered for strengthening the crystal grain boundary.

Residual part is substantially Ni and may contain unavoidable impurities.

Embodiments of the inventions of the present application will be further illustrated by way of the following examples.

EXAMPLES

A composition consisting of 12.0 of Co, 3.0 of Cr, 2.0 of Mo, 6.0 of W, 6.0 of Al, 6.0 of Ta, 5.0 of Re and 0.1 of Hf in terms of % by weight where the residual part was substantially consisted of Ni was prepared and subjected to a preliminary melting in a high-frequency vacuum melting furnace to prepare a melting stock. This was poured into a single crystal mold on a water-cooled copper plate heated by a graphite heater and then the mold was pulled down under the heater at the rate of 200 mm/hr so that the melted metal in the mold with selector was subjected to a directional solidification to the upper direction from the water-cooled copper plate making into single crystal to give an alloy sample (TMS75).

A composition consisting of 3.0 of Co, 2.0 of Cr, 0.4 of Mo, 5.0 of W, 5.7 of Al, 8.0 of Ta, 6.0 of Re, 0.03 of Hf, 0.1 of Nb and 0.2 of Ti in terms of % by weight where the residual part was substantially Ni was made into another alloy sample (CMSX10) which was a conventional alloy and used as a comparative sample.

The above samples were subjected to the evaluation for the following items. They were: ①  temperature range where the solution heat treatment was possible was determined; ② a creep test; ③ the sample was completely dipped in a melted salt of 25% NaCl+75% $Na_2SO_4$ at 900° C. for 20 hours and the corrosion resistance at high temperature was evaluated; and ④ the microstructure after heating at 1,100° C. for long time (1,000 hours) was evaluated.

Figure 2:
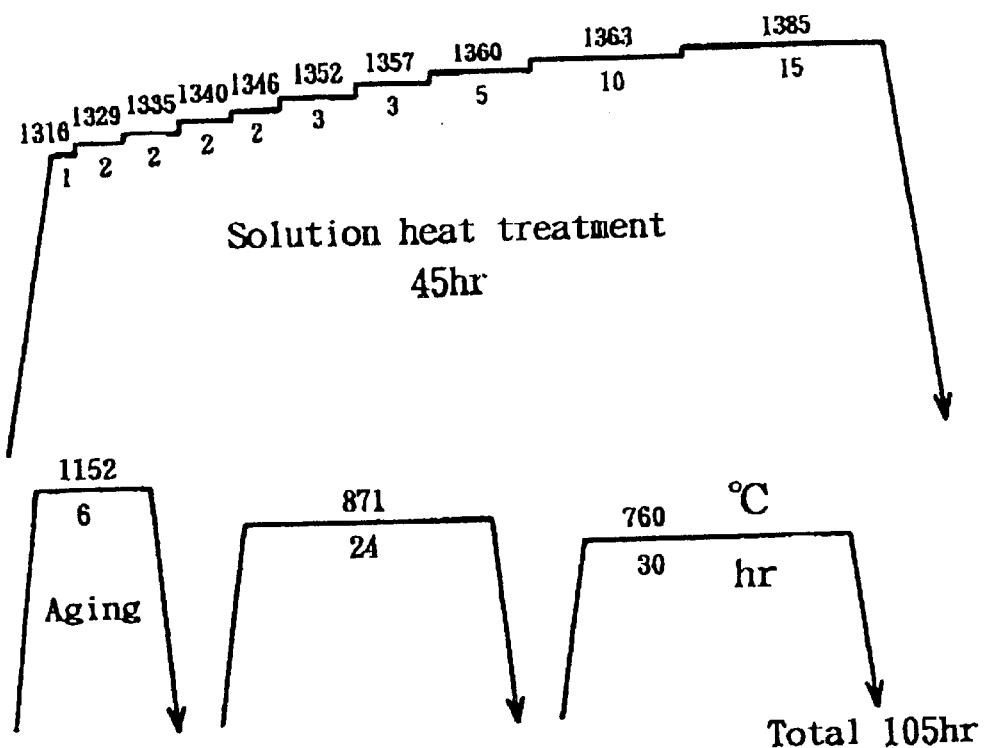
FIG. 2 is a drawing which shows the heat treatments of CMSX-10 alloy for comparison.

As a result, it was ascertained that TMS75 had a solution heat treatment range of about 40° C., i.e. from 1,310 to 1,350° C. Because of that, as shown in FIG. 1, the solution treatment of the TMS75 alloy was conducted by heating at 1,300° C. for one hour, for the sake of precaution followed, by keeping at 1,320° C. for five hours and cooling by air. After that, a two-step aging treatment was conducted. In the first aging step, the alloy was kept at 1,150° C. for four hours followed by cooling by air and, in the second aging step, it was kept at 870° C. for two hours followed by cooling by air. With regard to CMSX10, a solution treatment and an aging treatment were conducted according to a conventional method as shown in FIG. 2.

Figure 3:
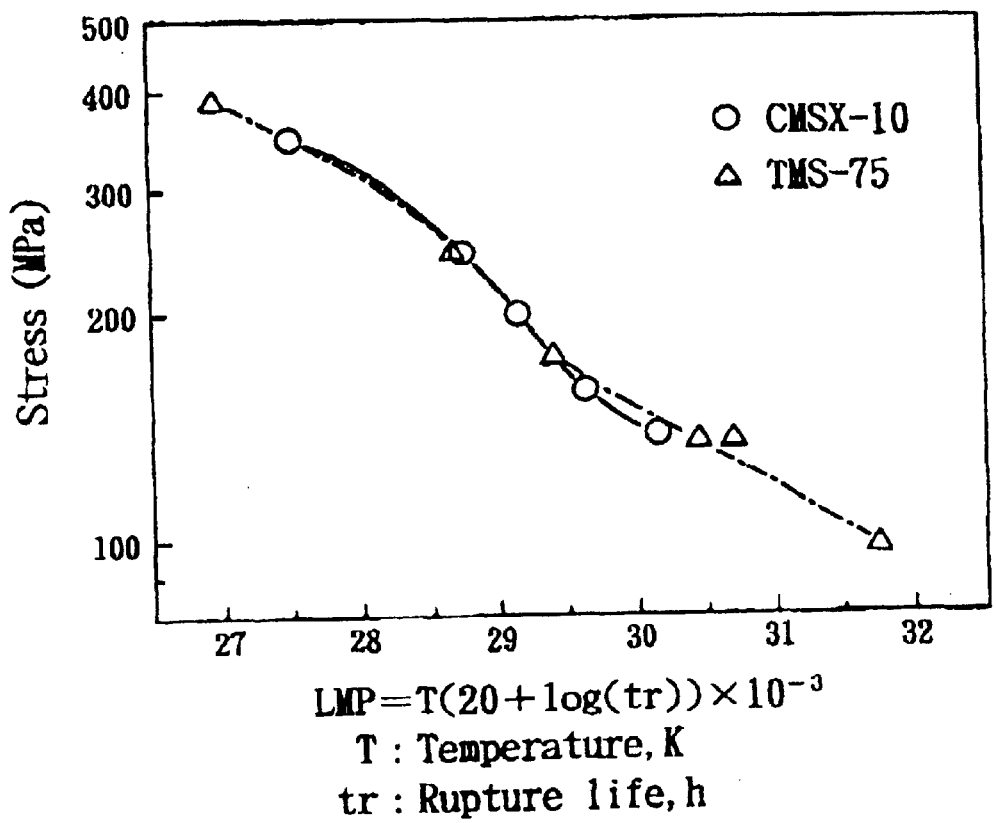
FIG. 3 is a drawing which shows the result of a creep test arranged in accordance with Larson-Miller's parameter.

Result of the creep test after the heat treatments was as shown in FIG. 3 arranged in accordance with Larson-Miller's parameter (right-hand side of the abscissa is higher temperature side; ordinate shows testing stress) and, at the side of low temperature and high stress, the alloy which was developed by the present inventors was in the same level as the comparative alloy CMSX10 while, at the side of high temperature and low stress, it showed better creep characteristics than CMSX10.

Figure 4:
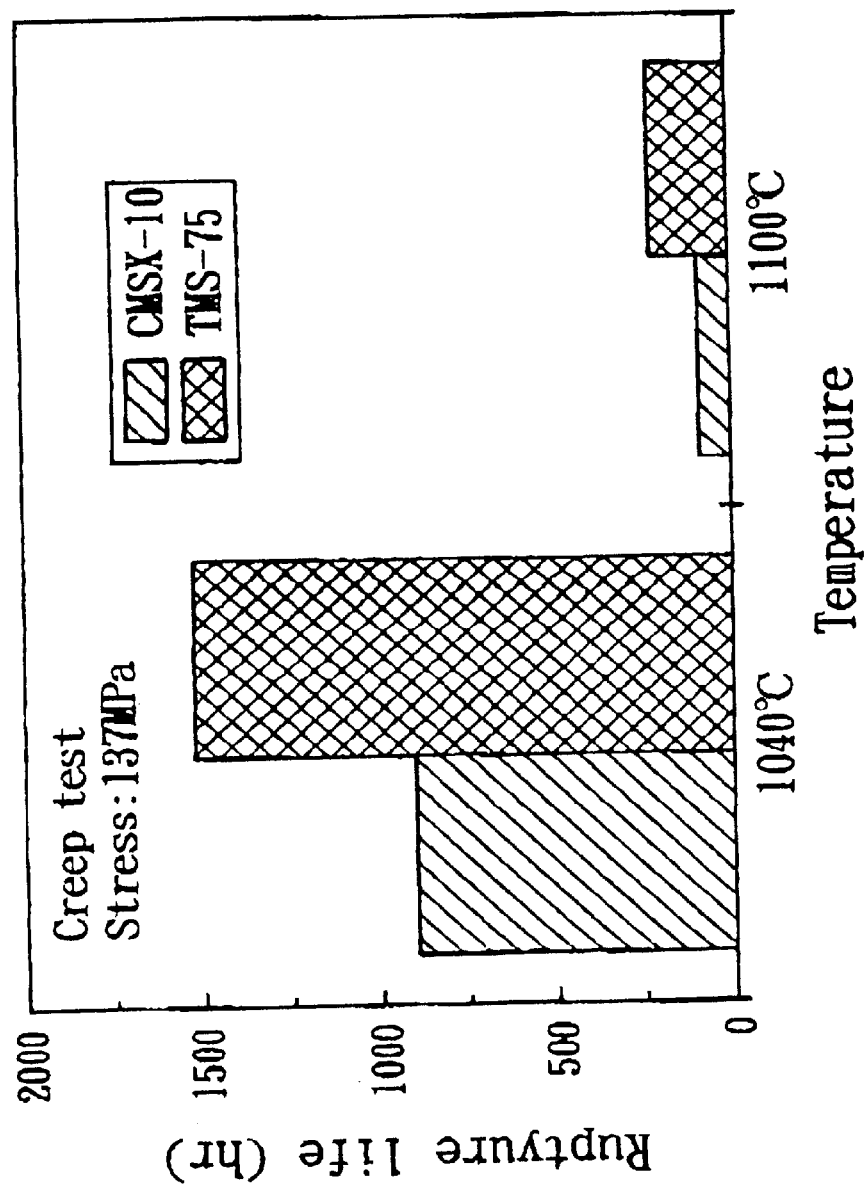
FIG. 4 is a drawing which shows the result of a creep tests at the temperature of 1040° C. and 1100° C. (stress: 137 MPa).

FIG. 4 shows results of the creep test at the temperature of 1040° C. and 1100° C. The stress is 137 MPa. It was found that TMS-75 of the present invention showed superior creep characteristics.

Corrosion resistance at high temperature was evaluated by completely dipping the sample in a fused salt of 25% NaCl+75% $Na_2SO_4$ at 900° C. for 20 hours. Size of the sample was made 6 mm in diameter and 4.5 mm in length. It has been said that, in general, the less the amount of Cr added, the better the corrosion resistance at high temperature. However, the result was that, as compared with the MarM247 cast alloy (containing 8.3% of chromium) which was tested at the same time, whole amount (not shorter than 3 mm calculated as the metal loss by the corrosion) of the MarM247 cast alloy was corroded before the term of 20 hours already while TMS75 alloy showed excellent corrosion resistance (0.01 mm) at high temperature.

In the evaluation of the microstructure after heating at 1,100° C. for as long as 1,000 hours, a harmful phase (which was believed to be same as that isolated in CMSX10—a single crystal superalloy of the third generation) was formed even in the case of TMS75 alloy. However, the ratio of the area including the part affected by this harmful phase was not less than 20% when heated at 1,100° C. for 1,000 hours in the case of CMSX10 while, in the case of TMS75 alloy, it was only 4% whereby the latter alloy had a stable microstructure where from a harmful phase was hardly formed.

MERIT OF THE INVENTION

As fully illustrated hereinabove, the inventions of the present application offer a nickel-based single crystal alloy which has a high strength, is easy in conducting the solution heat treatment, hardly gives a harmful phase and is resistant to corrosion at high temperature.

It is to be particularly noted that the solution treatment is very simple in the alloy of the present inventions and accordingly that the time required for the heat treatment can be made shorter. Moreover, even when it is used at high temperature for long time, a harmful phase is hardly formed, the microstructure is stable and the strength at high temperature is high.

When the nickel-based single crystal alloy having those advantages in accordance with the present inventions is utilized as a material for turbine blade and turbine vane, it is now possible to improve the thermal efficiency and output of the machinery and tools used at high temperature such as gas turbine for electricity generation and jet engine.

What is claimed is:

1. A nickel-based single crystal alloy, the composition of which consists essentially of 7–15 of Co, 0.1–4 of Cr, 1–4 of Mo, 4–7 of W, 5.5–6.5 of Al, 5–6.5 of Ta, 4–5.5 of Re, 0–0.5 each of Hf and V, and 0–2 each of Ti and Nb in terms of % by weight, and a residual part substantially being Ni, where said alloy may contain unavoidable impurities.

2. A nickel-bawd single crystal alloy according to claim 1, wherein said alloy consists essentially of Ni, 10–14 of Co, 2–3 of Cr, 1.5–2.5 of Mo, 5–6.5 of W, 5.7–6.3 of Al, 5.5–6.5 of Ta, 4.5–5 of Re and 0.01–0.3 of Hf in terms of % by weight.

3. A nickel-based single crystal alloy according to claim 1, wherein the amount of Ta is 5.5–6.5% by weight.

4. A method of manufacturing a nickel-based single crystal alloy according to claim 1 or 2, which comprises subjecting an alloy to solution heat treatment at 1,310–1,350° C. followed by aging heat treatment at 850–1,200° C. to form the alloy of claim 1 or 2.

5. A method of manufacturing a nickel-based single crystal alloy according to claim 4 wherein the solution heat treatment is conducted within ten hours and the aging heat treatment is conducted within thirty hours.

6. A method of manufacturing the nickel-based single crystal alloy according to claim 4 wherein each of the solution heat treatment and the aging heat treatment is conducted in a single step or by means of temperature changes in two to four steps.

7. A method of manufacturing the nickel-based single crystal alloy according to claim 4 wherein a preliminary heat treatment at from 1,290° C. to lower than 1,310° C. for two hours or shorter is conducted prior to the solution heat treatment.

8. A method of manufacturing a nickel-based single crystal alloy according to claim 5 wherein each of the solution heat treatment and the aging heat treatment is conducted in a single step or by means of temperature changes in two to four steps.

9. A method of manufacturing the nickel-based single crystal alloy according to claim 5 wherein a preliminary heat treatment at from 1,290° C. to lower than 1,310° C. for two hours or shorter is conducted prior to the solution heat treatment.

10. A method of manufacturing the nickel-based single crystal alloy according to claim 6 wherein a preliminary heat treatment at from 1,290° C. to lower than 1,310° C. for two hours or shorter is conducted prior to the solution heat treatment.

11. A method of manufacturing the nickel-based single crystal alloy according to claim 8 wherein a preliminary heat treatment at from 1,290° C. to lower than 1,310° C. for two hours or shorter is conducted prior to the solution heat treatment.

* * * * *